United States Patent
Lu et al.

(10) Patent No.: US 12,222,399 B2
(45) Date of Patent: Feb. 11, 2025

(54) METHOD AND APPARATUS FOR MEASURING REMAINING POWER LEVEL OF DEVICE

(71) Applicant: FEITIAN TECHNOLOGIES CO., LTD., Beijing (CN)

(72) Inventors: Zhou Lu, Beijing (CN); Huazhang Yu, Beijing (CN)

(73) Assignee: Feitian Technologies Co. Ltd., Beijing (CN)

( * ) Notice: Subject to any disclaimer, the term of this patent is extended or adjusted under 35 U.S.C. 154(b) by 267 days.

(21) Appl. No.: 17/799,563

(22) PCT Filed: Jun. 18, 2021

(86) PCT No.: PCT/CN2021/100762
§ 371 (c)(1),
(2) Date: Aug. 12, 2022

(87) PCT Pub. No.: WO2022/012261
PCT Pub. Date: Jan. 20, 2022

(65) Prior Publication Data
US 2023/0128424 A1    Apr. 27, 2023

(30) Foreign Application Priority Data
Jul. 16, 2020  (CN) .......................... 202010683762.1

(51) Int. Cl.
*G01R 31/3842* (2019.01)
*G01R 31/36* (2020.01)
(52) U.S. Cl.
CPC ..... *G01R 31/3842* (2019.01); *G01R 31/3646* (2019.01)

(58) Field of Classification Search
CPC ..................... G01R 31/3646; G01R 31/3842
See application file for complete search history.

(56) References Cited

U.S. PATENT DOCUMENTS

| 2010/0153752 A1* | 6/2010 | Tsukamoto | G06F 1/26 713/300 |
| 2014/0082580 A1* | 3/2014 | Bose | G06F 30/00 716/133 |

FOREIGN PATENT DOCUMENTS

| CN | 103472744 A | * 12/2013 | |
| CN | 105516901 A | * 4/2016 | |
| GB | 2503554 A | * 1/2014 | ........ H04W 52/0209 |

* cited by examiner

*Primary Examiner* — Natalie Huls
*Assistant Examiner* — Nyla Gavia
(74) *Attorney, Agent, or Firm* — Hammer & Associates, P.C.

(57) ABSTRACT

A method and apparatus for measuring the remaining power level of a device. The state of flag bits are detected, a password is calculated when a first flag bit is set, the password is displayed to reset the first flag bit, and the detection of the state of the flag bits is returned to; the total power consumption is calculated when a second flag bit is set, the remaining power level is updated on the basis of the total power consumption and of a second preset value, the second flag bit is reset, and the detection of the state of the flag bits is returned to. The present invention implements increased precision in measuring the remaining power level without additional component, accurately reflects the actual value of the remaining power level of a battery, and incurs no additional power consumption. This does not affect the service life of the device and is inexpensive.

8 Claims, 3 Drawing Sheets

METHOD AND APPARATUS FOR MEASURING REMAINING POWER LEVEL OF DEVICE

FIELD OF THE INVENTION

The present invention relates to a method for calculating remaining electric quantity of a device and an apparatus therefor, which belongs to the electricity measurement field.

BACKGROUND

When a user is using a low power consumption device with a screen, such as dynamic token, Bluetooth card, etc., displaying remaining electric quantity can remind a user of replacing or charging battery, the accuracy of displaying the remaining electric quantity of battery is an important performance criterion.

In the prior art, a method for determining battery electric quantity by detecting battery voltage via an analog-to-digital converting module exists, which cannot accurately reflect real value of remaining electric quantity of battery and the error is big.

There is another method for collecting remaining electric quantity by a voltmeter in the prior art, which can accurately reflect real value of a remaining electric quantity of the battery, but integrating a voltmeter into a displaying device with a screen will add power consumption of the device and reduce lifetime of the device, and the cost for using the device is high.

SUMMARY OF THE INVENTION

The object of the present invention is to provide a method for calculating remaining electric quantity of a device and an apparatus thereof, which can realize that accuracy of calculating remaining electric quantity is improved with no extra component, real value of remaining electric quantity of a battery is reflected accurately without extra power consumption; lifetime of the device is not shortened with a low using cost.

According to one aspect of the present invention, there is provided a method for calculating remaining electric quantity of a device, which includes:

Step S1, checking status of flags, when a first flag is set, executing Step S2, when a second flag is set, executing Step S4;

Step S2, activating a timer to start counting, calculating a password, closing the timer after finishing calculating a password, stopping counting to obtain time for calculating the password, resetting the timer, adding the time for calculating the password to a fourth register, then executing Step S3;

Step S3, displaying the password and the remaining electric quantity, resetting the first flag, then going back to Step S1;

Step S4, checking battery voltage, obtaining a preset wake-up current value, a password calculating current value and a displaying current value according to the battery voltage and a pre-stored first data table, obtaining a total consumption of power by summing up a product of the wake-up current value and data in a first register, a product of the password calculating current value and data in a fourth register, a product of the displaying current value and the result of a first preset value minus data in the fourth register;

Step S5, updating the remaining electric quantity according to the total consumption of power and a second preset value, resetting the second flag, and going back to Step S1;

during executing Step S1 to Step S5, when a real time clock interruption is detected, executing Step A1 to Step A4; the real time clock interruption is triggered every first preset time period;

Step A1, activating a timer to start counting, updating a second register and a sixth register by adding the first preset time period to the data in the second register and the data in the sixth register respectively, when the data in the second register is equal to a fourth preset value, executing Step A2; when the data in the second register is equal to the first preset value, executing Step A3;

Step A2, setting the first flag, clearing the data in the sixth register, execute Step A4;

Step A3, setting the second flag, then executing Step A4;

Step A4, closing the timer and stopping counting, obtaining time period for waking up, adding the time period for waking up to the first register.

According to the other aspect of the present invention, there is provided an apparatus for calculating remaining electric quantity of a device, which includes:

a detecting module configured to check status of flags, trigger a password calculating module when a first flag is set, trigger a total power consumption calculating module when a second flag is set;

the password calculating module is configured to activate a timer to start counting, calculate a password, close the timer after finishing calculate a password, stop counting to obtain time for calculating the password, reset the timer, add the time for calculating the password to a fourth register and trigger a displaying module;

the displaying module is configured to display the password and the remaining electric quantity, reset the first flag and trigger the detecting module;

the total power consumption calculating module is configured to check battery voltage, obtaining a preset wake-up current value, a password calculating current value and a displaying current value according to the battery voltage and a pre-stored first data table, obtain a total consumption of power by summing up the product of the wake-up current value and data in a first register, the product of the password calculating current value and data in a fourth register, the product of the displaying current value and the result of a first preset value minus data in the fourth register; and a remaining electric quantity updating module is configured to update the total consumption of power and a second preset value, reset the second flag and trigger the detecting module.

The device further includes: a real time clock module configured to calculate time of the device, trigger a waking up module every preset time period;

the waking up module is configured to activate a timer to start counting, update a second register and a sixth register by adding the first preset value to data in the second register and data in the sixth register, respectively, when the data in the second register is equal to a fourth preset value, set the first flag, clear the data in the sixth register, close the timer and stopping counting, obtain time period for waking up, add the time period for waking up to the first register; when the data in the second register is equal to the first preset value, set the second flag, close the timer and stop counting, obtain time period for waking up, add the time period for waking up to the first register.

According to a third aspect of the present invention, there is provided a method for calculating remaining electric quantity of a device, which includes:

Step S1, checking status of flags, when a first flag is set, executing Step S2, when a second flag is set, executing Step S4;

Step S2, activating a timer to start counting, calculating a password, closing the timer after finishing calculating the password, stopping counting to obtain time for calculating the password, resetting the timer, adding the time for calculating the password to a fourth register, then executing Step S3;

Step S3, displaying the password and the remaining electric quantity, resetting the first flag, then going back to Step S1;

Step S4, detecting battery voltage, obtaining a pre-stored first data table according to the detected battery, obtaining a preset current value and calculating total consumption of power according to the current value and corresponding time;

Step S5, updating the remaining electric quantity according to the total consumption of power and a second preset value, resetting a second flag, then going back to Step S1.

According to a fourth aspect of the present invention, there is provided an apparatus for calculating a remaining electric quantity of a device, which includes:

a detecting module configured to check status of flags, trigger a password calculating module when a first flag is set, trigger a total consumption of power module when a second flag is set;

the password calculating module configured to activate a timer to start counting, calculate a password, close the timer after finishing calculating a password, stop counting to obtain time for calculating the password, reset the timer, add the time for calculating the password to a fourth register and trigger a displaying module;

the displaying module configured to display the password and the remaining electric quantity, resetting the first flag, trigger the detecting module;

the total power consumption calculating module configured to detect battery voltage, obtain a pre-stored first data table according to the detected battery, obtain a preset current value and calculate total consumption of power according to the current value and corresponding time;

a remaining electric quantity updating module configured to update the remaining electric quantity according to the total consumption of power and a second preset value, reset a second flag and trigger the detecting module.

Comparing with the prior art, the present invention has the following advantages:

According to the present invention, a method for calculating a remaining electric quantity of a device is provided, which can improve an accuracy for calculating the remaining electric quantity without any extra component, a real value of the remaining electric quantity of a battery can be reflected accurately without any extra power consumption; a lifetime of the device is not compromised, while using the device is with a low cost.

DESCRIPTION OF EMBODIMENTS

In order to more clearly illustrate the embodiments of the present disclosure or in prior art, the accompanying drawings will be briefly described below. It will be obvious that the drawings in the following description are merely some of the embodiments of the present disclosure, and those skilled in the art can obtain other drawings according to these drawings without creative work.

Embodiment 1

Figure 1:
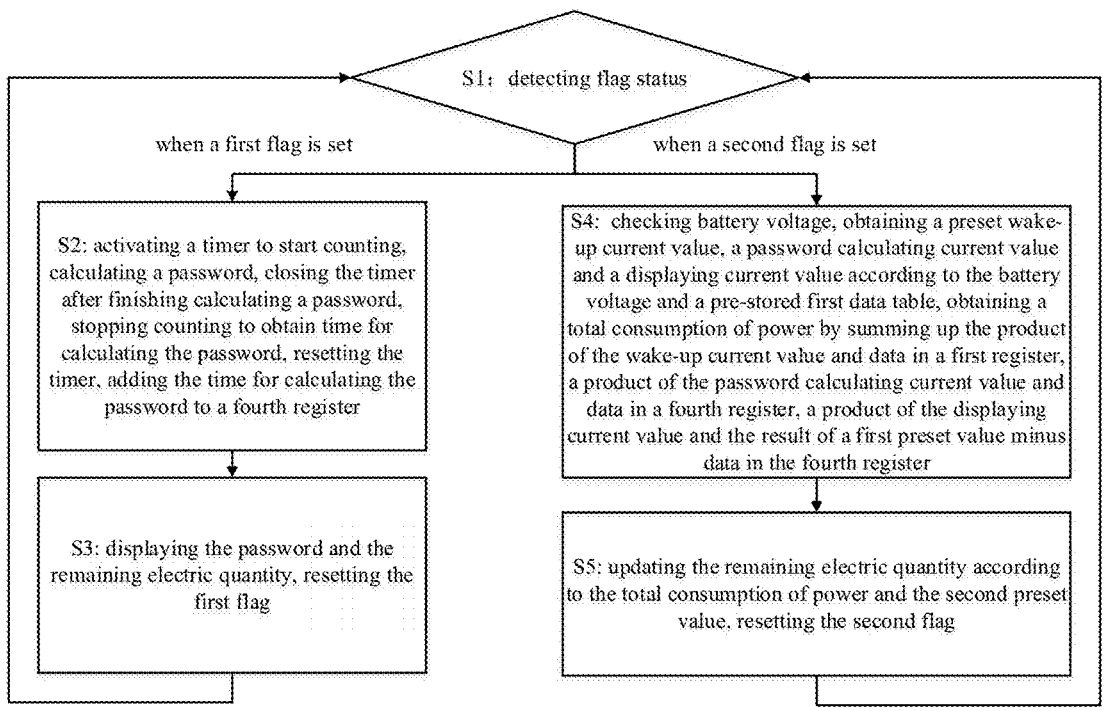
FIG. 1 is a flow chart of a method for calculating remaining electric quantity of a device provided by Embodiment 1 of the present invention.

Embodiment 1 provides a method for calculating remaining electric quantity of a device, which is used for a dynamic token of displaying always type. As shown in FIG. 1, the method includes:

Step S1, detecting flag status, when a first flag is set, executing Step S2; when a second flag is set, executing Step S4;

Step S2, activating a timer to start counting, calculating a password, closing the timer after finishing calculating the password, stopping counting to obtain time for calculating the password, resetting the timer, adding the time for calculating the password to a fourth register, then executing Step S3;

preferably, in Embodiment 1, closing the timer after finishing calculating a password, stopping counting to obtain time for calculating the password, resetting the timer specifically comprises:

stopping counting after finishing calculating the password, obtaining a third value from a timer register, obtaining time for calculating the password according to the third value, then clearing the third value;

Step S3, displaying the password and the remaining electric quantity, resetting the first flag, then going back to Step S1;

Step S4, checking battery voltage, obtaining a preset wake-up current value, a password calculating current value and a displaying current value according to the battery voltage and a pre-stored first data table, obtaining a total consumption of power by summing up a product of the wake-up current value and data in a first register, a product of the password calculating current value and data in a fourth register, a product of the displaying current value and the result of a first preset value minus data in the fourth register;

preferably, in Embodiment 1, the total consumption of power=wake-up current value×data in the first register+password calculating current value×data in the fourth register+displaying current value×(a first preset value−data in the fourth register);

The pre-stored first data table is as the following:

| Module | Battery voltage | | |
|---|---|---|---|
| | V >= 2.8 V | 2.8 V > V >= 2.6 V | V < 2.6 V |
| Displaying | A first displaying current | A second displaying current | A third displaying current |
| Password calculating | a first password calculating current | a second password calculating current | a third password calculating current |
| Waking up | A first wake-up current | A second wake-up current | A third wake-up current |

Step S5, updating the remaining electric quantity according to the total consumption of power and a second preset value, resetting the second flag and going back to Step S1;
preferably, in the present embodiment, Step S5 specifically includes:

Step S5-1, determining whether the total consumption of power is less than a second preset value, if yes, storing the total consumption of power in a power consumption counting register and executing Step S5-2; otherwise, updating the remaining electric quantity with a result of deducting a third preset value from the remaining electric quantity, storing a difference of the total consumption of power and the second preset value in the power consumption counting register, executing Step S5-2;

Step S5-2, determining whether the value in the power consumption counting register is less than a second preset value, if yes, restoring the value in the second register to be an initial value and resetting the second flag, going back to Step S1; if no, updating the remaining electric quantity with a result of deducting a third preset value from the remaining electric quantity, updating the power consumption counting register with a difference of the value of the power consumption register and the second preset value, restoring the value in the second register to be the initial value, resetting the second flag, going back to Step S1.

In a process for executing Step S1 to Step S5, when a real time clock interruption is detected, executing Step A1 to Step A4, the real time clock interruption is triggered every preset time period;

Step A1, activating a timer to start counting, updating a second register and a sixth register by adding the first preset value to the data in the second register and the data in the sixth register respectively, when the data in the second register is equal to a fourth preset value, executing Step A2; when the data in the second register is equal to the first preset value, executing Step A3;

Step A2, setting the first flag, clearing the data in the sixth register, then execute Step A4;

Step A3, setting the second flag, then executing Step A4;

Step A4, closing the timer to stop counting, obtaining a time period for waking up, and adding the time period for waking up to the first register.

Preferably, in Embodiment 1, closing the timer to stop counting, obtaining a time period for waking up specifically includes: closing the timer to stop the counting, obtaining a first value from a timer register, obtaining the time period for waking up according to the first value, and then clearing the first value.

Embodiment 2

Embodiment 2 provides a method for calculating remaining electric quantity of a device, which is used for a dynamic token of displaying always type. The method includes the following steps.

Step 101, a dynamic token is powered up, initializes clock source rate of a timer, frequency division coefficient and an initial counting value and goes into sleep status.

Specifically, the battery of the dynamic token is set to be full electric quantity status.

Step 102, when real time clock interruption of the dynamic token is detected, activating a timer to start counting; when real time clock interruption is ended, close the timer and stopping counting, obtaining a first value from the timer register, obtain time of real time clock interruption according to the first value, clock source rate of the time, frequency division coefficient and the initial counting value and taking the real time clock interruption time as time period for waking up, adding the time period for waking up to a first register, clearing the first value; updating a second register and a sixth register by adding the first preset value to the data in the second register and the data in the sixth register respectively, executing Step 103; the real time clock interruption is triggered every first preset time period.

Specifically, the first preset time period is 1 second.

Step 103, the dynamic token determines whether the value in the sixth register is equal to a fourth preset value, if yes, execute Step 104, otherwise, execute Step 106.

Specifically, the fourth preset value is 60 s, the first preset value is 86400 s.

Step 104, The dynamic token actives the time and starts counting, calculates a password, closes the timer after finishing calculating a password, obtains a third value from a timer register, obtains time for calculating the password according to the third value, adds the time for calculating the password to a fourth register and clears the third value.

Specifically, the time for calculating the password=(the third value−the initial counting value+1)×(the frequency division coefficient+1)/the clock source rate.

Step 105, the dynamic token displays a password and the remaining electric quantity, clears data in the sixth register, execute Step 106.

The password is displayed as well as the remaining electric quantity is displayed. For example, a battery symbol is set with five grids, each grid represents 20% of electric quantity, grid of battery symbol is displayed according to a specific value of the remaining electric quantity; or a battery symbol is set with statuses of full electric quantity, half electric quantity and low electric quantity, which represents displaying 2 grids, displaying 1 grid and blank block respectively; for example, if the remaining electric quantity is more than ⅓ of nominal electric quantity, the battery symbol is displayed with two grids which represents that current status is full electric quantity; if the remaining electric quantity is more than the ⅓ of nominal electric quantity and less than ⅔ of nominal electric quantity, the battery symbol is regarded as status of half electric quantity which is displayed with one grid; if the remaining electric quantity is less than ⅓ of nominal electric quantity, the battery symbol represents status of low electric quantity and is displayed with a blank block and prompts a user that battery electric quantity is not enough with flashing light; or a battery symbol is set with displaying a remaining electric quantity according to proportion and displaying percentage of the remaining electric quantity, for example, 95%.

Specifically, the time period for waking up=(the first value−the initial counting value+1)×(the frequency division coefficient+1)/clock source rate.

Step 106, the dynamic token determines whether the value in the second register is equal to the first preset value, if yes, execute Step 107; otherwise, go back to Step 102.

Specifically, the first preset value is 86400 seconds, i.e., every 24 hours is regarded as a period.

Step 107, the dynamic token detects battery voltage, searches for a pre-stored battery voltage-current data table according to a detected battery voltage, determines current value of every corresponding module and calculates total consumption of power; execute Step 108.

| | Battery Voltage | | |
|---|---|---|---|
| Module | V >= 2.8 V | 2.8 V > V >= 2.6 V | V < 2.6 V |
| Displaying | a first displaying current | a second displaying current | a third displaying current |
| Password calculating | a first password calculating current | a second password calculating current | a third password calculating current |
| Waking up | a first waking up current | a second waking up current | a third waking up current |

Specifically, the pre-stored battery voltage-current data table is read, if the battery voltage is more than or equal to 2.8V, the current value corresponding to the displaying module is the first displaying current, the current value corresponding to the password calculating module is the first password calculating current, and the current value corresponding to the waking up module is the first waking up current.

If the battery voltage is more than or equal to 2.6V and less than 2.8V, the current value corresponding to the displaying module is the second displaying current, the current value corresponding to the password calculating module is the second password calculating current; the current value corresponding to the waking up module is the second waking up current.

If the battery voltage is less than 2.6 V, the current value corresponding to the displaying module is the third displaying current, the current value corresponding to the password calculating module is the third password calculating current, the current value corresponding to the waking up module is the third waking up current.

For example, the dynamic token detects that the battery voltage is 3V, the current value corresponding to the displaying module is the first displaying current, the current value corresponding to the password calculating module is the first password calculating current value, the current value corresponding to the waking up module is the first waking up current, and the dynamic token calculates consumption of power of the three function modules, respectively, in which the power consumption of the displaying module=the first displaying current×(the first preset value−the time for calculating password);

the power consumption of the password calculating module=the first password calculating current×the time for calculating password;

specifically, the time for calculating password is data in the fourth register;

the power consumption of the waking up module=the first waking up current×(the time period for waking up−the time for calculating password);

specifically, the time period for waking up is the data in the first register;

the total consumption of power=the power consumption of the displaying module+the power consumption of the password calculating module+the power consumption of the waking up module.

Step 108, the dynamic token determines whether the total consumption of power is less than a second preset value, if yes, store the total consumption of power to a power consumption counting register, execute Step 109; otherwise, update the remaining electric quantity with a result of deducting a third preset value from the remaining electric quantity; store a difference of the total consumption of power and the second preset value in a power consumption counting register, execute Step 109.

Step 109, the dynamic token determines the value in the power consumption counting register is less than the second preset value, if yes, clear the data in the second register and go back to Step 102; otherwise, update the remaining electric quantity with a result of deducting the third preset value from the remaining electric quantity, update the power consumption counting register with a different of the value of the power consumption counting register and the second preset value, clear the data in the second register, go back to Step 102.

Embodiment 3

Figure 2:
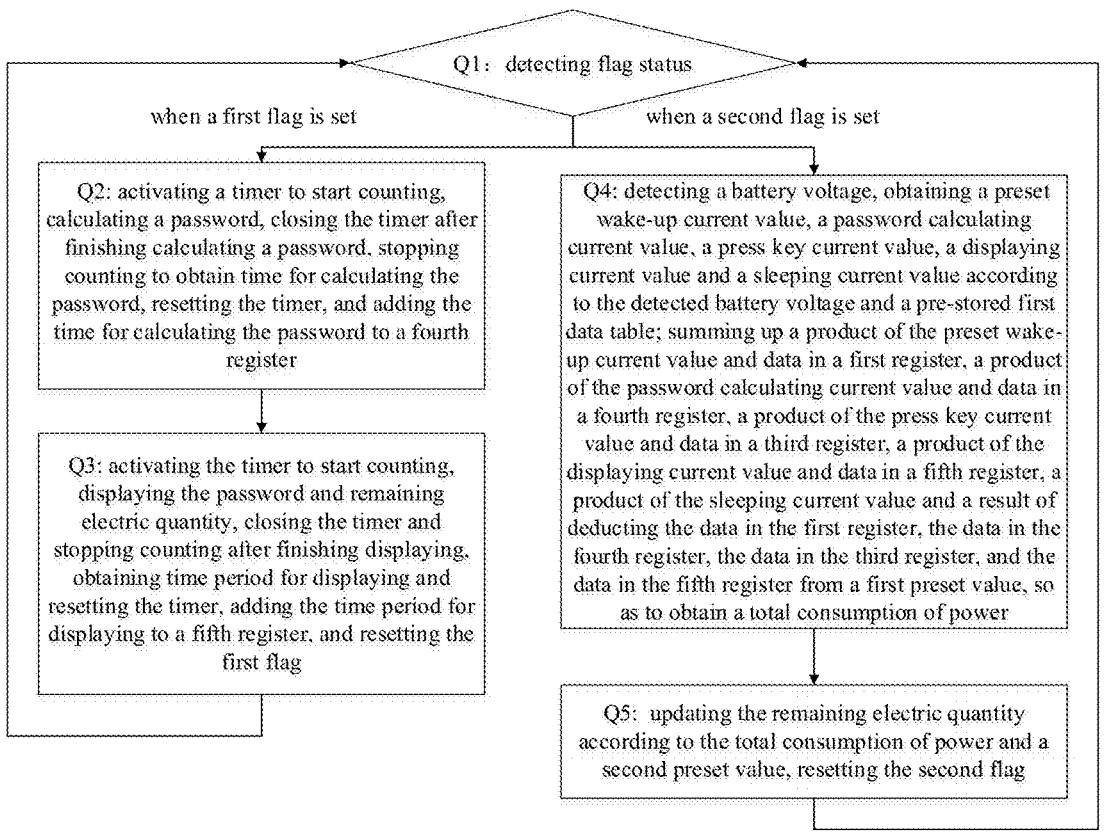
FIG. 2 is a flow chart of a method for calculating remaining electric quantity of a device provided by Embodiment 3 of the present invention.

Embodiment 3 provides a method for calculating remaining electric quantity of a device, which is used for a dynamic token of pressing key type. As shown in FIG. 2, the method includes the following steps.

Step Q1, detecting flag status, when a first flag is set, executing Step Q2; when a second flag is set, executing Step Q4.

Step Q2, activating a timer to start counting, calculating a password, closing the timer after finishing calculation of the password, stopping counting to obtain a time for calculating the password, resetting the timer, and adding the time for calculating the password into a fourth register, then executing Step Q3.

Step Q3, activating the timer to start counting, displaying the password and the remaining electric quantity, closing the timer for stopping counting after displaying is ended, obtaining a time period for displaying, and resetting the timer, adding the time period for displaying into a fifth register, and resetting the first flag, then going back to Step Q1.

Step Q4, detecting a battery voltage, obtaining a preset wake-up current value, a password calculating current value, a press key current value, a displaying current value and a sleeping current value according to the detected battery voltage and a pre-stored first data table; summing up a product of the preset wake-up current value and data in a first register, a product of the password calculating current value and data in a fourth register, a product of the press key current value and data in a third register, a product of the displaying current value and data in a fifth register, a product of the sleeping current value and a result of deducting the data in the first register, the data in the fourth register, the data in the third register, and the data in the fifth register from a first preset value, so as to obtain a total consumption of power.

Preferably, in the present Embodiment 2, the total consumption of power=the preset wake-up current value×the data in the first register+the password calculating current value×the data in the fourth register+the press key current value×the data in the third register+the displaying current value×the data in the fifth register+the sleeping current value×(the first preset value−the data in the first register−the data in the fourth register−the data in the third register−the data in the fifth register).

The pre-stored first data table is as the following:

| Module | Battery voltage | | |
| --- | --- | --- | --- |
| | V >= 2.8 V | 2.8 V > V >= 2.6 V | V < 2.6 V |
| Press key | a first press key current | a second press key current | a third press key current |
| Displaying | a first displaying current | a second displaying current | a third displaying current |
| Password calculating | a first password calculating current | a second password calculating current | a third password calculating current |
| Sleeping | a first sleeping current | a second sleeping current | a third sleeping current |
| Waking up | a first waking up current | a second waking up current | a third waking up current |

Step Q5, updating the remaining electric quantity according to the total consumption of power and a second preset value, resetting the second flag, then going back to Step Q1.

In a process of executing Step Q1 to Step Q5, when a real time clock interruption is detected, executing Step B1 to Step B2; the real time clock interruption is triggered every preset time period.

Step B1, activating a timer to start counting, updating the second register with a result of adding the data in the second register to a preset time period, determining whether the data in the second register is equal to the first preset value, if yes, set the second flag, execute Step B2; otherwise, execute Step B2.

Step B2, closing the timer and stopping counting, obtaining time period for waking up, adding the time period for waking up to the first register.

In the process of executing Step Q1 to Step Q5, the method further includes: when press key interruption is detected, activating the timer to start counting, setting the first flag, closing the timer and stopping counting when a second level is detected, obtaining time period for pressing key, and adding the time period for pressing key to the third register, then quitting the press key interruption.

Preferably, in Embodiment 3, closing the timer after finishing password calculating, stopping counting to obtain the time for calculating password and resetting the timer specifically is: closing the timer after finishing password calculating, obtaining a third value from a timer register, and obtaining time for calculating password according to the third value, then clearing the third value.

Preferably, in Embodiment 3, closing the timer and stopping counting, obtaining time period for waking up specifically includes: closing the timer and stopping counting, obtaining a first value from a timer register, obtaining the time period for waking up according to the first value, and clearing the first value.

Preferably, in Embodiment 3, stopping counting when displaying is finished, obtaining time period for displaying and resetting the timer specifically is: stopping counting when displaying is finished, obtaining a fourth value from the time register, obtaining the time period for displaying according to the fourth value, adding the time period for displaying to the fifth register, and clearing the fourth value.

Preferably, in Embodiment 3, Step Q3 further includes: ending displaying when a first level is detected, activating the timer to start counting, when a second level is detected, closing the timer and stopping counting, obtaining a second value from the timer register, obtaining the time period for pressing key according to the second value, adding the time period for pressing key to the third register, and clearing the second value.

Preferably, in Embodiment 3, closing the timer and stopping counting when a second level is detected, obtaining time period for pressing key specifically includes: closing the timer and stopping counting when a second level is detected, obtaining the second value from the timer register, obtaining the time period for pressing key according to the second value, and clearing the second value.

Preferably, in Embodiment 3, the Step Q3 is replaced with: activating the timer to start counting, displaying the password, stopping counting when the displaying is ended to obtain the time period for displaying, adding the time period for displaying to a fifth register, and resetting the first flag, then going back to Step Q1.

Preferably, in Embodiment 3, Step Q3 further includes: when a first level is detected, activating a second timer to start counting, closing the second timer and stopping counting when a second level is detected, obtaining a fifth number from a second timer register, obtaining time period for pressing key according to the fifth number, adding the time period for pressing key to a third register, clearing the fifth number, if the time period for pressing key is more than or equal to a fifth preset value, switching screen to display the remaining electric quantity; if the time period for pressing key is less than the fifth preset value, closing the timer and stopping counting, obtaining a fourth value from the timer register, obtaining time period for displaying according to the fourth value, adding the time period for displaying to the fifth register, and clearing the fourth value.

Preferably, in Embodiment 3, Step Q5 specifically includes:

Step Q5-1, determining whether the total consumption of power is less than a second preset value, if yes, storing the total consumption of power in the power consumption counting register, execute Step Q5-2; otherwise, updating the remaining electric quantity with the result of deducting a third preset value from the remaining electric quantity, storing a difference of the total consumption of power and the second preset value in the power consumption counting register, then executing Step Q5-2;

Step Q5-2, determining whether the value of the power consumption counting register is less than the second preset value, if yes, restoring the value in the second register to be an initial value, resetting the second flag, going back to Step Q1, otherwise, updating the remaining electric quantity with the result of deducting the third preset value from the remaining electric quantity, updating the power consumption counting register with the difference of the value of the power consumption counting register and the second value, restoring the value in the second register as the initial value, resetting the second flag, then going back to Step Q1.

Embodiment 4

Embodiment 4 provides a method for calculating remaining electric quantity of a device, which is used for a dynamic token of pressing key type. The method includes the following steps.

Step 201, the dynamic token is powered up, initializes clock source rate of a timer, frequency division coefficient and an initial counting value.

Specifically, the battery of the dynamic token is set to be full electric quantity status.

Step 202, the dynamic token goes into sleep status.

Step 203, the dynamic token determines whether a real time clock interruption happens, if yes, activating a timer to start counting; when real time clock interruption is ended, close the timer and stopping counting, obtain a first value from a timer register, obtain time of real time clock interruption according to the first value, clock source rate of the time, frequency division coefficient and the initial counting value and taking the real time clock interruption time as time period for waking up, adding the time period for waking up to a first register, clearing the first value, execute Step 204; otherwise, execute Step 205; the real time clock interruption is triggered every first preset time period.

Specifically, the time period for waking up=(the first value−the initial counting value+1)×(the frequency division coefficient+1)/the clock source rate.

Step 204, the dynamic token updates the second register with the result of summing up the value in the second register and the first preset time period, when the value of the second register is equal to the first preset value, execute Step 209.

Specifically, the first preset value is 86400 seconds, i.e., every 24 hours is a period.

Step 205, the dynamic token determines whether a press key is triggered by a user, if yes, execute Step 206, otherwise, go back to Step 203.

Step 206, activating the timer to start counting, closing the timer and stopping counting when a second level is detected, obtaining a second value from the timer register, obtaining a time period for pressing key according to the second value, a timer clock source rate of the timer, a frequency division coefficient, an initial counting value, adding the time period for pressing key to a third register, then clearing the second value.

Specifically, when the second level is high level, when the press key is trigger by the user, a low level is detected; and when the second level is low level, when the press key is triggered by the user, a high level is detected.

Specifically, the time period for pressing key=(the second value−the initial counting value+1)×(the frequency division coefficient+1)/the clock source rate.

Step 207, the dynamic token activates the timer and starts counting, calculating password, closing the timer and stopping counting after finishing calculating password, obtains a third value from the timer register, obtains time for calculating password according to the third value, the clock source rate of the timer, the frequency division coefficient and the initial counting value, adds the time for calculating password to a fourth register, clears the third value.

Specifically, the time for calculating password=(the third value−the initial counting value+1)×(the frequency division coefficient+1)/the clock source rate.

Step 208, the dynamic token activates the timer and starts counting, displays a password and the remaining electric quantity, determines whether triggering of a press key from a user, if yes, closes the timer and stops counting, obtains a fourth value from a timer register, obtains time period for displaying according to the fourth value, the clock source rate of the timer, the frequency division coefficient, the initial counting value, adding the time period for displaying to a fifth register, clears the fourth value, go back to Step 203, otherwise, adds a preset time period for displaying to the fifth register, and clears the value in the timer register, then goes back to Step 203.

Specifically, when receiving triggering of press key from the user, the time period for displaying password=(the fourth value−the initial counting value+1)×(the frequency division coefficient+1)/the clock source rate.

Specifically, in Step 208, after clearing the fourth value, the method further includes: the dynamic token activates timer and starts counting, closes timer and stops counting when a second level is detected, obtains a second value from the timer register, obtains the time period for pressing key according to the second value, the clock source rate of timer, the frequency division coefficient, the initial counting value, adds the time period for pressing key to a third register, and clears the second value.

Specifically, when the second level is high level, the triggering of press key from the user is low level; when the second level is low level, the triggering of press key from the user is high level.

Specifically, the password is displayed as well as the remaining electric quantity is displayed. For example, a battery symbol is set with five grids, each grid represents 20% of electric quantity, grid of battery symbol is displayed according to a specific value of the remaining electric quantity; or a battery symbol is set with statuses of full electric quantity, half electric quantity and low electric quantity, which represents displaying 2 grids, displaying 1 grid and blank block respectively; for example, if the remaining electric quantity is more than ⅓ of nominal electric quantity, the battery symbol is displayed with two grids which represents that current status is full electric quantity; if the remaining electric quantity is more than the ⅓ of nominal electric quantity and less than ⅔ of nominal electric quantity, the battery symbol is regarded as status of half electric quantity which is displayed with one grid; if the remaining electric quantity is less than ⅓ of nominal electric quantity, the battery symbol represents status of low electric quantity and is displayed with a blank block and prompts a user that battery electric quantity is not enough with flashing light; or a battery symbol is set with displaying remaining electric quantity according to proportion and displaying percentage of the remaining electric quantity, for example, 95%.

Preferably, Step 208 can be replaced by that the dynamic token activates the timer and starts counting, displays the password, stops counting after finishing displaying, obtains a fourth value from the timer register, obtains time period for displaying according to the fourth value, adds the time period for displaying to the fifth register, and clears the fourth value.

Preferably, in Embodiment 4, Step 208 further includes:
    when a first level is detected, activating a second timer to start counting, closing the second timer and stopping counting when a second level is detected, obtaining a fifth number from a second timer register, obtaining time period for pressing key according to the fifth number, adding the time period for pressing key to a third register, clearing the fifth number, if the time period for pressing key is more than or equal to a fifth preset value, switching screen to display the remaining electric quantity; if the time period for pressing key is less than the fifth preset value, closing the timer and stopping counting, obtaining a fourth value from the timer register, obtaining time period for displaying according to the fourth value, adding the time period for displaying to the fifth register, and clearing the fourth value.

Specifically, the fifth preset value is 3 s.

Specifically, when the first level is high level, the second level is low level, when the first level is low level, the second level is high level.

Specifically, the time period for pressing key=(the second value−the initial counting value+1)×(the frequency division coefficient+1)/the clock source rate.

Step 209, the dynamic token detects battery voltage, searches for a pre-stored battery voltage-current data table according to a detected battery voltage, determines current value of every corresponding module and calculates total consumption of power; execute Step 210.

Specifically, in order to avoid error generated by disruption when the dynamic token detects battery voltage, mean filtering method is used which calculates average value of collected consecutive sample values.

The pre-stored battery voltage-current data table is as the following:

| Module | Battery voltage | | |
|---|---|---|---|
| | V >= 2.8 V | 2.8 V > V >= 2.6 V | V < 2.6 V |
| Press key | a first press key current | a second press key current | a third press key current |
| Displaying | a first displaying current | a second displaying current | a third displaying current |
| Password calculating | a first password calculating current | a second password calculating current | a third password calculating current |
| Sleeping | a first sleeping current | a second sleeping current | a third sleeping current |
| Waking up | a first waking up current | a second waking up current | a third waking up current |

Specifically, read the pre-stored battery voltage-current data table, if the battery voltage is more than or equal to 2.8V, the current value corresponding to the press key module is the first press key current, the current value corresponding to the displaying module is the first displaying current, the current value corresponding to the password calculating module is the first password calculating current, the current value corresponding to the sleeping module is the first sleeping current, and the current value corresponding to the waking up module is the first waking up current.

If the battery voltage is more than or equal to 2.6V and less than 2.8V, the current value corresponding to the module of pressing key is the second press key current, the current value corresponding to the displaying module is the second displaying current, the current value corresponding to the password calculating module is the second password calculating current, and the current value corresponding to the waking up module is the second waking up current.

If the battery voltage is less than 2.6V, the current value corresponding to the pressing key module is the third press key current, the current value corresponding to the displaying module is the third displaying current, the current value corresponding to the password calculating module is the third password calculating current, the current value corresponding to the sleeping module is the third sleeping current, and the current value corresponding to the waking up module is the third waking up current.

For example, the dynamic token detects that the battery voltage is 3V, the current value corresponding to the press key module is the first press key current, the current value corresponding to the displaying module is the first displaying current, the current value corresponding to the password calculating module is the first password calculating current, the current value corresponding to the sleeping module is the first sleeping current, the current value corresponding to the waking up module is the first waking up current, and the respective power consumption of the five modules are calculated as follows:

the power consumption of the press key module=the first press key current×the time period for pressing key;

specifically, the time period for pressing key is the data in the third register;

the power consumption of the displaying module=the first displaying current×the total time period for displaying;

specifically, the time period for displaying is the data in the fifth register;

the power consumption of the password calculating module=the first password calculating current×the time for password calculating;

specifically, the time for password calculating is data in the fourth register;

the power consumption of the waking up module=the first waking up current×the time period for waking up;

specifically, the time period for waking up is data in the second register;

the power consumption of the sleeping module=the first sleeping current×(the first preset value−the total time period−the total time period for pressing key−the time for calculating password−the time period for waking up);

the total consumption of power=the power consumption of the press key module+the power consumption of the displaying module+the power consumption of the password calculating module+the power consumption of the sleeping module+the power consumption of the waking up module.

Step 210, the dynamic token determines whether the total consumption of power is less than a second preset value, if yes, store the total consumption of power in a power consumption counting register, execute Step 211.

Specifically, the second preset value is 2700000 uAs, the third preset value is 1%.

For example, the battery electric quantity is 75 mAh, 1% of the battery electric quantity is 0.75 mAh; because current of each function module corresponds to uA level, 1% of the battery electric quantity is represented by uAs, i.e., 0.75 mAh=2700000 uAs.

Step 211, the dynamic token determines whether the value in the power consumption counting register is less than the second preset value, if yes, clear the data in the second register, go back to Step 203; otherwise, update the remaining electric quantity with a result of deducting a third preset value from the remaining electric quantity, update the power consumption counting register with a difference of the value in the power consumption counting register and the second preset value, and clear the data in the second register, then go back to Step 203.

Embodiment 5

Figure 3:
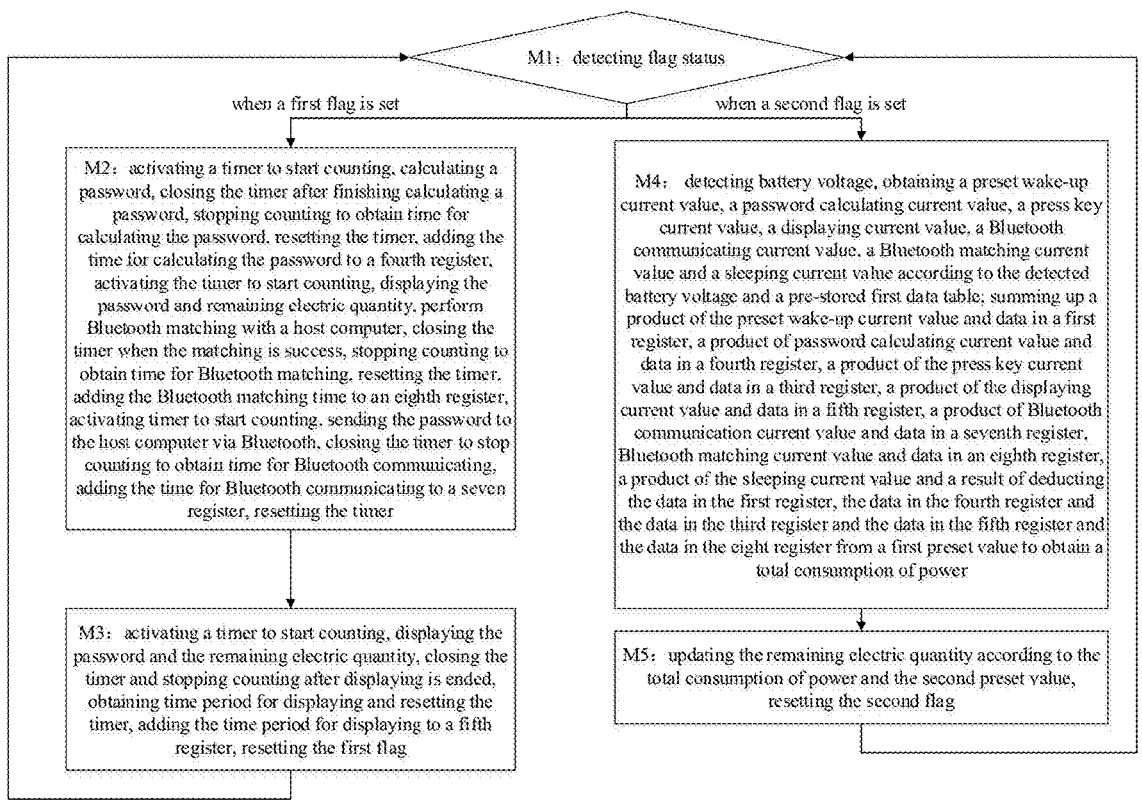
FIG. 3 is a flow chart of a method for calculating remaining electric quantity of a device provided by Embodiment 5 of the present invention.

Embodiment 5 provides a method for calculating a remaining electric quantity of a device, which is used for a Bluetooth card. As shown in FIG. 3, the method includes the following steps.

Step M1, detecting flag status, when a first flag is set, executing Step M2; when a second flag is set, executing Step M4.

Step M2, activating a timer to start counting, calculating a password, closing the timer after finishing calculation of the password, stopping counting to obtain a time for calculating the password, resetting the timer, adding the time for calculating the password into a fourth register, activating the timer to start counting, performing Bluetooth matching with a host computer, closing the timer when the matching is successful, stopping counting to obtain a time for Bluetooth matching, resetting the timer, adding the Bluetooth matching time into an eighth register, activating timer to start counting, sending the password to the host computer via Bluetooth, closing the timer to stop counting to obtain a time for Bluetooth communicating, adding the time for Bluetooth communicating into a seven register, and resetting the timer, then executing Step M3.

Step M3, activating a timer to start counting, displaying the password and the remaining electric quantity, closing the timer for stopping counting after displaying is ended, obtaining a time period for displaying, resetting the timer, and adding the time period for displaying into a fifth register, and resetting the first flag, then going back to Step M1.

Step M4, detecting a battery voltage, obtaining a preset wake-up current value, a password calculating current value, a press key current value, a displaying current value, a Bluetooth communicating current value, a Bluetooth matching current value, and a sleeping current value according to the detected battery voltage and a pre-stored first data table; summing up a product of the preset wake-up current value and data in a first register, a product of the password calculating current value and data in a fourth register, a product of the press key current value and data in a third register, a product of the displaying current value and data in a fifth register, a product of the Bluetooth communication current value and data in a seventh register, the Bluetooth matching current value and data in an eighth register, and a product of the sleeping current value and a result of deducting the data in the first register, the data in the fourth register and the data in the third register, the data in the fifth register, the data in a seventh register, and the data in the eight register from a first preset value, so as to obtain a total consumption of power.

Preferably, in Embodiment 5, the total consumption of power=the preset wake-up current value×the data in the first register+the password calculating current value×the data in the fourth register+the press key current value×the data in the third register+the displaying current×the data in the fifth register+the Bluetooth communication current value×the data in the seventh register+the Bluetooth matching current× the data in the eighth register+the sleeping current×(the first preset value−the data in the first register−the data in the fourth register−the data in the third register−the data in the fifth register−the data in the seventh register−the data in the eighth register).

The pre-stored first data table is as the following:

| Module | Battery voltage | | |
|---|---|---|---|
| | V >= 2.8 V | 2.8 V > V >= 2.6 V | V < 2.6 V |
| Press key | a first press key current | a second press key current | a third press key current |
| Displaying | a first displaying current | a second displaying current | a third displaying current |
| Sleeping | a first sleeping current | a second sleeping current | a third sleeping current |
| Waking up | a first waking up current | a second waking up current | a third waking up current |
| Password calculating | a first password calculating current | a second password calculating current | a third password calculating current |
| Bluetooth communicating | a first Bluetooth communication current | a second Bluetooth communication current | a third Bluetooth communication current |
| Bluetooth matching | a first Bluetooth matching current | a second Bluetooth matching current | a third Bluetooth matching current |

Step M5, updating the remaining electric quantity according to the total consumption of power and a second preset value, and resetting the second flag, then going back to Step M1.

In a process of executing Step M1 to Step M5, when a real time clock interruption is detected, executing Step B1 to Step B2; the real time clock interruption is triggered every preset time period.

Step B1, activating a timer to start counting, updating the second register with a result of adding the data in the second register to a preset time period, determining whether the data in the second register is equal to the first preset value, if yes, set the second flag, execute Step B2; otherwise, execute Step B2.

Step B2, closing the timer and stopping counting, obtaining time period for waking up, adding the time period for waking up to the first register.

In the process of executing Step M1 to Step M5, the method further includes: when press key interruption is detected, activating the timer to start counting, setting the first flag, closing the timer and stopping counting when a second level is detected, obtaining time period for pressing key, and adding the time period for pressing key to the third register, then quitting press key interruption.

Preferably, in Embodiment 5, obtaining the time for Bluetooth matching specifically is: obtaining a seventh value from the timer and obtaining the time for Bluetooth matching according to the seventh value.

Obtaining the time for Bluetooth communicating specifically is: obtaining a sixth value from the timer register and obtaining the time for Bluetooth communicating according to the sixth value.

Preferably, in Embodiment 5, closing the timer after finishing password calculating, stopping counting to obtain the time for calculating password and resetting the timer specifically is: closing the timer after finishing password calculating, obtaining a third value from a timer register, and obtaining time for calculating password according to the third value, then clearing the third value.

Preferably, in Embodiment 5, closing the timer and stopping counting, obtaining time period for waking up specifically includes: closing the timer and stopping counting, obtaining a first value from a timer register, obtaining the time period for waking up according to the first value, and clearing the first value.

Preferably, in Embodiment 5, stopping counting when displaying is finished, obtaining time period for displaying and resetting the timer specifically is: stopping counting when displaying is finished, obtaining a fourth value from the time register, obtaining the time period for displaying according to the fourth value, adding the time period for displaying to the fifth register, and clearing the fourth value.

Preferably, in Embodiment 5, Step M3 further includes: ending displaying when a first level is detected, activating the timer to start counting, when a second level is detected, closing the timer and stopping counting, obtaining a second value from the timer register, obtaining the time period for pressing key according to the second value, adding the time period for pressing key to the third register, and clearing the second value.

Preferably, in Embodiment 5, closing the timer and stopping counting when a second level is detected, obtaining time period for pressing key specifically includes: closing the timer and stopping counting when a second level is detected, obtaining the second value from the timer register, obtaining the time period for pressing key according to the second value, and clearing the second value.

Preferably, in Embodiment 5, the Step M3 is replaced with: activating the timer to start counting, displaying the password, stopping counting when the displaying is ended to obtain the time period for displaying, adding the time period for displaying to a fifth register, and resetting the first flag, then going back to Step S1.

Preferably, in Embodiment 3, Step M3 further includes:
when a first level is detected, activating a second timer to start counting, closing the second timer and stopping counting when a second level is detected, obtaining a fifth number from a second timer register, obtaining time period for pressing key according to the fifth number, adding the time period for pressing key to a third register, clearing the fifth number, if the time period for pressing key is more than or equal to a fifth preset value, switching screen to display the remaining electric quantity; if the time period for pressing key is less than the fifth preset value, closing the timer and stopping counting, obtaining a fourth value from the timer register, obtaining time period for displaying according to the fourth value, adding the time period for displaying to the fifth register, and clearing the fourth value.

Preferably, in Embodiment 3, Step M5 specifically includes:

Step M5-1, determining whether the total consumption of power is less than a second preset value, if yes, storing the total consumption of power in the power consumption counting register, then executing Step M5-2; otherwise, updating the remaining electric quantity with the result of deducting a third preset value from the remaining electric quantity, storing a difference of the total consumption of power and the second preset value in the power consumption counting register, then executing Step M5-2;

Step Q5-2, determining whether the value of the power consumption counting register is less than the second preset value, if yes, restoring the value in the second register to be an initial value, resetting the second flag, going back to Step M1, otherwise, updating the remaining electric quantity with the result of deducting the third preset value from the remaining electric quantity, updating the power consumption counting register with the difference of the value of the power consumption counting register and the second preset value, restoring the value in the second register as the initial value, and resetting the second flag, then going back to Step M1.

Embodiment 6

Embodiment 6 provides a method for calculating a remaining electric quantity of a device, which is used for a Bluetooth card. The method includes the following steps.

Step 301, the Bluetooth card is powered up, initializes clock source rate of a timer, frequency division coefficient and an initial counting value.

Specifically, the battery of the Bluetooth card is set to be full electric quantity status.

Step 302, the Bluetooth card goes into sleep status.

Step 303, the Bluetooth card determines whether a real time clock interruption happens, if yes, activating a timer to start counting; when real time clock interruption is ended, close the timer and stopping counting, obtain a first value from a timer register, obtain time of real time clock interruption according to the first value, clock source rate of the time, frequency division coefficient and the initial counting value and taking the real time clock interruption time as time period for waking up, adding the time period for waking up to a first register, clearing the first value, execute Step 304; otherwise, execute Step 305; and the real time clock interruption is triggered every first preset time period.

Specifically, the first preset time is 1 second.

Specifically, the time period for waking up=(the first value−the initial counting value+1)×(the frequency division coefficient+1)/clock source rate.

Step 304, the Bluetooth card updates the second register with the result of summing up the value in the second register and the first preset time period, when the value of the second register is equal to the first preset value, execute Step 309.

Specifically, the first preset value is 86400 seconds, i.e., every 24 hours is a period.

Step 305, the Bluetooth card determines whether a press key is triggered by a user, if yes, execute Step 306, otherwise, go back to Step 303.

Step 306, activating the timer to start counting, closing the timer and stopping counting when a second level is detected, obtaining a second value from the timer register, obtaining a time period for pressing key according to the second value, a timer clock source rate of the timer, a frequency division coefficient, an initial counting value, and adding the time period for pressing key to a third register, then clearing the second value.

Specifically, the time period for pressing key=(the second value−the initial counting value+1)×(the frequency division coefficient+1)/the clock source rate.

Step 307, the Bluetooth card activates the timer and starts counting, calculating password, closing the timer and stopping counting after finishing calculating password, obtains a third value from the timer register, obtains time for calculating password according to the third value, the clock source rate of the timer, the frequency division coefficient and the initial counting value, adds the time for calculating password to a fourth register, clears the third value, actives the timer and starts counting, performs Bluetooth matching with a host computer, closing the timer and stopping counting when Bluetooth matching is successful, obtains a seventh value from the timer register, obtains time for Bluetooth matching according to the clock source rate, the frequency division coefficient and the initial counting value, adds the time for Bluetooth matching to an eighth register, clears the seventh value, activates the timer and starts counting, obtains a sixth value from the timer register, obtains a time for Bluetooth communication according to the sixth value, the clock source rate, the frequency division coefficient and the initial counting value, and adding the time for Bluetooth communicating to the seventh register, then clearing the sixth value;

Specifically, the time period for calculating the password= (the third value−the initial counting value+1)×(the frequency division coefficient+1)/the clock source rate.

Specifically, the time for Bluetooth matching=(the seventh value−the initial counting value+1)×(the frequency division coefficient+1)/the clock source rate.

Specifically, the time for Bluetooth communicating=(the sixth value−the initial counting value+1)×(the frequency division coefficient+1)/the clock source rate.

Specifically, the password is displayed as well as the remaining electric quantity is displayed. For example, a battery symbol is set with five grids, each grid represents 20% of electric quantity, grid of battery symbol is displayed according to a specific value of the remaining electric quantity; or a battery symbol is set with statuses of full electric quantity, half electric quantity and low electric quantity, which represents displaying 2 grids, displaying 1 grid and blank block respectively; for example, if the remaining electric quantity is more than ⅓ of nominal electric quantity, the battery symbol is displayed with two grids which represents that current status is full electric quantity; if the remaining electric quantity is more than the ⅓ of nominal electric quantity and less than ⅔ of nominal electric quantity, the battery symbol is regarded as status of half electric quantity which is displayed with one grid; if the remaining electric quantity is less than ⅓ of nominal electric quantity, the battery symbol represents status of low electric quantity and is displayed with a blank block and prompts a user that battery electric quantity is not enough with flashing light; or a battery symbol is set with displaying remaining electric quantity according to proportion and displaying percentage of the remaining electric quantity, for example, 95%.

Step 308, the Bluetooth card activates the timer and starts counting, displays a password and the remaining electric quantity, determines whether triggering of a press key from a user, if yes, closes the timer and stops counting, obtains a fourth value from a timer register, obtains time period for displaying according to the fourth value, the clock source rate of the timer, the frequency division coefficient, the initial counting value, adding the time period for displaying to a fifth register, clears the fourth value, go back to Step 303, otherwise, adds a preset time period for displaying to the fifth register, and clears the value in the timer register, then goes back to Step 303.

Specifically, when receiving triggering of press key from the user, the time period for displaying the password=(the fourth value−the initial counting value+1)×(the frequency division coefficient+1)/the clock source rate.

Specifically, in Step 308, after clearing the fourth value, the method further includes: the Bluetooth card activates timer and starts counting, closes timer and stops counting when a second level is detected, obtains a second value from the timer register, obtains the time period for pressing key according to the second value, the clock source rate of timer, the frequency division coefficient, the initial counting value, adds the time period for pressing key to a third register, and clears the second value.

Preferably, Step 308 can be replaced by that the Bluetooth card activates the timer and starts counting, displays the password, stops counting after finishing displaying password, obtains a fourth value from the timer register, obtains time period for displaying according to the fourth value, adds the time period for displaying to the fifth register, and clears the fourth value.

Preferably, in Embodiment 6, Step 308 further includes:

when a first level is detected, activating a second timer to start counting, closing the second timer and stopping counting when a second level is detected, obtaining a fifth number from a second timer register, obtaining time period for pressing key according to the fifth number, adding the time period for pressing key to a third register, clearing the fifth number, if the time period for pressing key is more than or equal to a fifth preset value, switching screen to display the remaining electric quantity; if the time period for pressing key is less than the fifth preset value, closing the timer and stopping counting, obtaining a fourth value from the timer register, obtaining time period for displaying according to the fourth value, adding the time period for displaying to the fifth register, and clearing the fourth value.

Specifically, the fifth preset value is 3 s.

Specifically, when the first level is high level, the second level is low level, when the first level is low level, the second level is high level.

Specifically, the time period for pressing key=(the second value−the initial counting value+1)×(the frequency division coefficient+1)/the clock source rate.

Step 309, the Bluetooth card detects battery voltage, searches for a pre-stored battery voltage-current data table according to a detected battery voltage, determines current value of every corresponding module and calculates total consumption of power; then execute Step 310.

Specifically, in order to avoid error generated by disruption when the Bluetooth card detects battery voltage, mean filtering method is used which calculates average value of collected consecutive sample values.

The pre-stored battery voltage-current data table is as the following:

|  | Battery voltage | | |
| --- | --- | --- | --- |
| Module | V >= 2.8 V | 2.8 V > V >= 2.6 V | V < 2.6 V |
| Press key | a first press key current | a second press key current | a third press key current |
| Displaying | a first displaying current | a second displaying current | a third displaying current |
| Sleeping | a first sleeping current | a second sleeping current | a third sleeping current |
| Waking up | a first waking up current | a second waking up current | a third waking up current |
| Password calculating | a first password calculating current | a second password calculating current | a third password calculating current |
| Bluetooth communicating | a first Bluetooth | a second Bluetooth | a third Bluetooth |

| | Battery voltage | | |
|---|---|---|---|
| Module | V >= 2.8 V | 2.8 V > V >= 2.6 V | V < 2.6 V |
| Bluetooth matching | communication current a first Bluetooth matching current | communication current a second Bluetooth matching current | communication current a third Bluetooth matching current |

Specifically, read the pre-stored battery voltage-current data table, if the battery voltage is more than or equal to 2.8V, the current value corresponding to the press key module is the first press key current, the current value corresponding to the displaying module is the first displaying current, the current value corresponding to the password calculating module is the first password calculating current, the current value corresponding to the sleeping module is the first sleeping current, and the current value corresponding to the waking up module is the first waking up current.

If the battery voltage is more than or equal to 2.6V and less than 2.8V, the current value corresponding to the module of pressing key is the second press key current, the current value corresponding to the displaying module is the second displaying current, the current value corresponding to the sleeping module is the second sleeping current, the current value corresponding to the waking up module is the second waking up current, the current value corresponding to the password calculating module is the second password calculating current, the current value corresponding to the Bluetooth communicating module is the second Bluetooth communication current, and the current value corresponding to the Bluetooth matching module is the second Bluetooth matching current.

If the battery voltage is less than 2.6V, the current value corresponding to the pressing key module is the third press key current, the current value corresponding to the displaying module is the third displaying current, the current value corresponding to the sleeping module is the third sleeping current, the current value corresponding to the waking up module is the third waking up current, the current value corresponding to the password calculating module is the third password calculating current, the current value corresponding to the Bluetooth communicating module is the third Bluetooth communication current, and the current value corresponding to the Bluetooth matching module is the third Bluetooth matching current.

For example, if the Bluetooth care detects that the battery voltage is 3V, the current value corresponding to the module of pressing key is the first press key current, the current value corresponding to the displaying module is the first displaying current, the current value corresponding to the sleeping module is the first sleeping current, the current value corresponding to the waking up module is the first waking up current, the current value corresponding to the password calculating module is the first password calculating current, the current value corresponding to the Bluetooth communicating module is the first Bluetooth communication current, the current value corresponding to the Bluetooth matching module is the first Bluetooth matching current; and the respective consumption of power of the five modules are calculated as follows:

the power consumption of the press key module=the first press key current×the time period for pressing key; specifically, the time period for pressing key is the data in the third register;

the power consumption of the displaying module=the first displaying current×the total time period for displaying; specifically, the total time period for displaying is the data in the fifth register;

the power consumption of the waking up module=the first waking up current×the time period for waking up; specifically, the time period for waking up is data in the second register;

the power consumption of the password calculating module=the first password calculating current×the time for password calculating;

specifically, the time for password calculating is data in the fourth register;

the power consumption of the Bluetooth communicating module=the first Bluetooth communication current×the time for Bluetooth communicating;

specifically, the time for Bluetooth communicating is data in the seventh register;

the power consumption of the Bluetooth matching module=the first Bluetooth matching current×the time for Bluetooth matching;

specifically, the time for Bluetooth matching is the data in the eighth register;

the power consumption of the sleeping module=the first sleeping current×(the first preset value−the total time period for displaying−the total time period for pressing key−the total time period for waking up−the total time period for password calculating−the time for Bluetooth communicating−the time for Bluetooth matching);

the total consumption of power=the power consumption of the press key module+the power consumption of the displaying module+the power consumption of the sleeping module+the power consumption of the password calculating module+the power consumption of the Bluetooth communicating module+the power consumption of the Bluetooth matching module.

Step 310, the Bluetooth card determines whether the total consumption of power is less than a second preset value, if yes, store the total consumption of power in a power consumption counting register, execute Step 311; otherwise, update the remaining electric quantity with a result of deducting a third preset from the remaining electric quantity, stores a difference of the total consumption of power and the second preset value in the power consumption counting register, execute Step 311.

Specifically, the second preset value is 2700000 uAs, the third preset value is 1%.

For example, the battery electric quantity is 75 mAh, 1% of the battery electric quantity is 0.75 mAh; because current of each function module corresponds to uA level, 1% of the battery electric quantity is represented by uAs, i.e., 0.75 mAh=2700000 uAs.

Step 311, the Bluetooth card determines whether the value in the power consumption counting register is less than the second preset value, if yes, clear the data in the second register, go back to Step 303; otherwise, update the remaining electric quantity with a result of deducting a third preset value from the remaining electric quantity, update the power consumption counting register with a difference of the value in the power consumption counting register and the second preset value, clear the data in the second register, and go back to Step 303.

Embodiment 7

Figure 4:
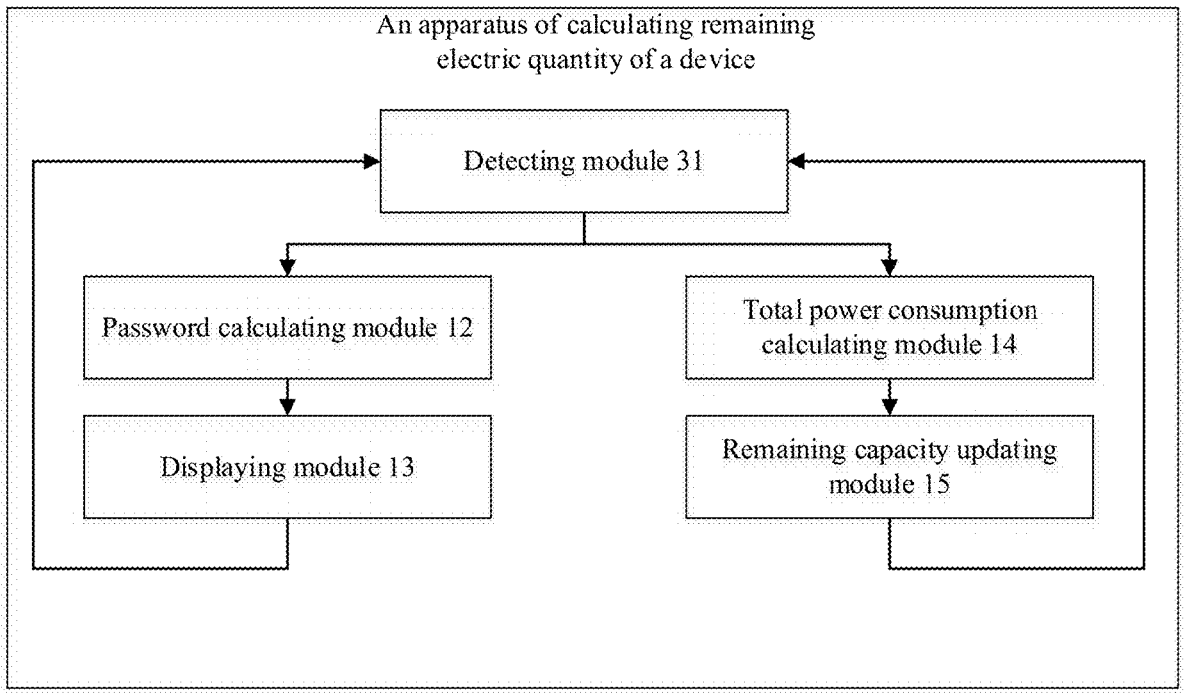
FIG. 4 is a block diagram of an apparatus of calculating remaining electric quantity of a device provided by Embodiment 7 of the present invention.

Embodiment 7 of the present invention provides an apparatus of calculating a remaining electric quantity of a device, which is used for a dynamic toke of displaying always type. As shown in FIG. 4, the method includes:
- a detecting module 11 configured to detect flag status, trigger password calculating module 12 when a first flag is set, trigger a total power consumption calculating module 14 when a second flag is set;
- the password calculating module 12 configured to activate a timer to start counting, calculate a password, close the timer after finishing calculating a password, stop counting to obtain time for calculating the password, reset the timer, add the time for calculating the password to a fourth register and trigger a displaying module 13;
- the displaying module 13 is configured to display the password and the remaining electric quantity, resetting the first flag and trigger the detecting module 11;
- the total power consumption calculating module 14 is configured to check battery voltage, obtain a preset wake-up current value, a password calculating current value and a displaying current value according to the battery voltage and a pre-stored first data table, obtain a total consumption of power by summing up a product of the wake-up current value and data in a first register, a product of the password calculating current value and data in a fourth register, a product of the displaying current value and the result of a first preset value minus data in the fourth register;
- a remaining electric quantity updating module 15 configured to update the remaining electric quantity according to the total consumption of power and a second preset value, reset the second flag and trigger the detecting module 11.

The apparatus further includes: a real time clock module configured to calculate time of the device and trigger a waking up module every preset time;
- the waking up module is configured to activate a timer to start counting, update a second register and a sixth register by adding the first preset value to the data in the second register and the data in the sixth register respectively, when the data in the second register is equal to a fourth preset value, set the first flag, clear the data in the sixth register, close the timer and stopping counting, obtain time period for waking up, add the time period for waking up to the first register; when the data in the second register is equal to the first preset value, set the second flag, close the timer and stop counting, obtain time period for waking up, and add the time period for waking up to the first register.

Preferably, in Embodiment 7, the password calculating module 12 is further configured to stop counting after finishing calculating a password, obtain a third value from a timer register, obtain time for calculating the password according to the third value, clear the third value.

Preferably, in Embodiment 7, the waking up module is further configured to close the timer and stop counting, obtain a first value from a timer register, obtain time period for waking up according to the first value and clear the first value.

Preferably, in Embodiment 7, the remaining electric quantity updating module 15 includes:
- a first determining sub-module configured to determine whether the whether the total consumption of power is less than a second preset value, if yes, store the total consumption of power in a power consumption counting register and trigger a second sub-determining module; otherwise, update the remaining electric quantity with a result of deducting a third preset value from the remaining electric quantity, store a difference of the total consumption of power and the second preset value in the power consumption counting register and trigger the second determining sub-module;
- the second determining sub-module configured to determine whether the value in the power consumption counting register is less than a second preset value, if yes, restore the value in the second register to be an initial value and reset the second flag, trigger the detecting module 11; if no, update the remaining electric quantity with a result of deducting a third preset value from the remaining electric quantity, update a difference of the value of the power consumption register and the second preset value to the power consumption counting register, restore the value in the second register to be the initial value, reset the second flag, and trigger the detecting module 11.

Embodiment 8

Figure 5:
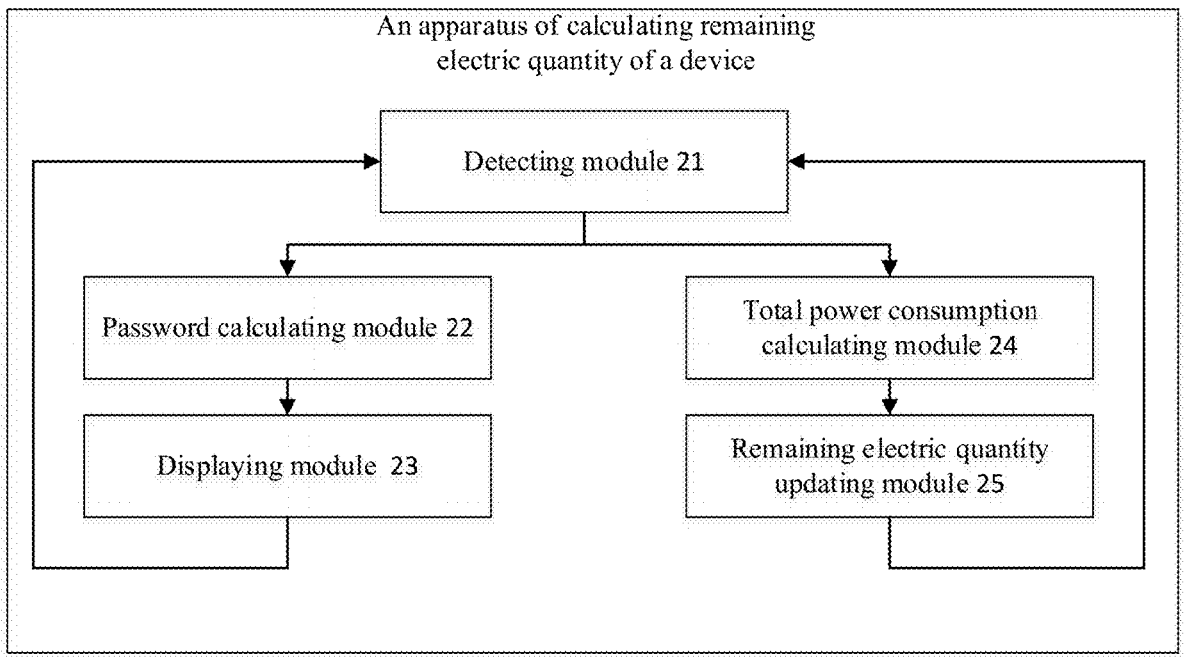
FIG. 5 is a block diagram of an apparatus of calculating remaining electric quantity of a device provided by Embodiment 8 of the present invention.

Embodiment 8 of the present invention provides an apparatus of calculating a remaining electric quantity of a device, which is used for a dynamic token of pressing key type. As shown in FIG. 5, the apparatus includes:
- a detecting module 21 configured to detect flag status, when a first flag is set, trigger a password calculating module 22, when a second flag is set, trigger a total power consumption calculating module 24;
- the password calculating module 22 configured to activate a timer to start counting, calculate a password, close the timer after finishing calculating a password, stop counting to obtain time for calculating the password, reset the timer, add the time for calculating the password to a fourth register, trigger a displaying module 23;
- the displaying module 23 configured to activate the timer to start counting, display the password and remaining electric quantity, close the timer and stopping counting after finishing displaying, obtaining time period for displaying and resetting the timer, add the time period for displaying to a fifth register, reset the first flag, trigger the detecting module 21;
- the total power consumption calculating module 24 configured to detect battery voltage, obtain a preset wake-up current value, a password calculating current value, a press key current value, a displaying current value and a sleeping current value according to the detected battery voltage and a pre-stored first data table; sum up a product of the preset wake-up current value and data in a first register, a product of password calculating current value and data in a fourth register, a product of the press key current value and data in a third register, a product of the displaying current value and data in a fifth register, a product of the sleeping current value and a result of deducting the data in the first register, the data in the fourth register and the data in the third register and the data in the fifth register from a first preset value, so as to obtain a total consumption of power;
- the remaining power module updating 25 configured to update the remaining electric quantity according to the total consumption of power and a second preset value, resetting the second flag, trigger the detecting module 21.

The apparatus further includes: a real clock module configured to calculate time of the device, trigger the waking up module every preset period of time;
- a waking up module specifically is configured to activate a timer to start counting, update the second register with a result of adding the data in the second register to a preset time period, determine whether the data in the second register is equal to the first preset value, if yes, set the second flag, close the timer and stopping counting, obtain time period for waking up, add the time period for waking up to the first register; if no, close the timer and stopping counting, obtain time period for waking up, and add the time period for waking up to the first register;

a press key interruption module configured to activate timer to start counting, set the first flag, close the timer to stop counting when a second level is detected, obtain time period for pressing key, add the time period for pressing key to a third register, exit press key interruption.

Preferably, in Embodiment 8, the password calculating module 22 is further configured to stop counting when password calculating is finished, obtain a third value form the time register, obtain time for calculating password according to the third value, and clear the third value.

Preferably, in Embodiment 8, the waking up module is further configured to close the timer to stop counting, obtain a first value from the timer register, obtain time period for waking up according to the first value, and clear the first value.

Preferably, in Embodiment 8, the displaying module 23 is further configured to stop counting when displaying is finished, obtain a fourth value from the time register, obtain the time period for displaying according to the fourth value, adding the time period for displaying to the fifth register, and clear the fourth value.

Preferably, in Embodiment 8, the displaying module 23 is further configured to end displaying when a first level is detected, activate the timer to start counting, when a second level is detected, close the timer and stopping counting, obtain a second value from the timer register, obtain the time period for pressing key according to the second value, add the time period for pressing key to the third register, and clear the second value.

Preferably, in Embodiment 8, the press key interruption module is further configured to close the timer and stop counting when a second level is detected, obtain the second value from the timer register, obtain the time period for pressing key according to the second value, and clear the second value.

Preferably, in Embodiment 8, the displaying module 23 is replaced with a second displaying module, the second displaying module is configured to activate the timer to start counting, display the password, stop counting when the displaying is ended to obtain the time period for displaying, add the time period for displaying to a fifth register, resetting the first flag, and trigger the detecting module.

Preferably, in Embodiment 8, the second displaying module is further configured to activate a second timer to start counting when a first level is detected, close the second timer and stop counting when a second level is detected, obtain a fifth number from a second timer register, obtain time period for pressing key according to the fifth number, add the time period for pressing key to a third register, clear the fifth number, switching screen to display the remaining electric quantity if the time period for pressing key is more than or equal to a fifth preset value; close the timer and stop counting if the time period for pressing key is less than the fifth preset value, obtain a fourth value from the timer register, obtain time period for displaying according to the fourth value, add the time period for displaying to the fifth register, and clear the fourth value.

Preferably, in Embodiment 8, the remaining electric quantity updating module 25 includes:

a first determining sub-module configured to determine whether the total consumption of power is less than a second preset value, if yes, store the total consumption of power in the power consumption counting register, trigger a second sub-determining module; otherwise, update the remaining electric quantity with the result of deducting a third preset value from the remaining electric quantity, store a difference of the total consumption of power and the second preset value in the power consumption counting register, and trigger the second determining sub-module;

the second determining sub-module configured to determine whether the value of the power consumption counting register is less than the second preset value, if yes, restore the value in the second register to be an initial value, reset the second flag, trigger the detecting module 21, otherwise, update the remaining electric quantity with the result of deducting the third preset value from the remaining electric quantity, update the power consumption counting register with the difference of the value of the power consumption counting register and the second preset value, restore the value in the second register as the initial value, reset the second flag, and trigger the detecting module 21.

Embodiment 9

Figure 6:
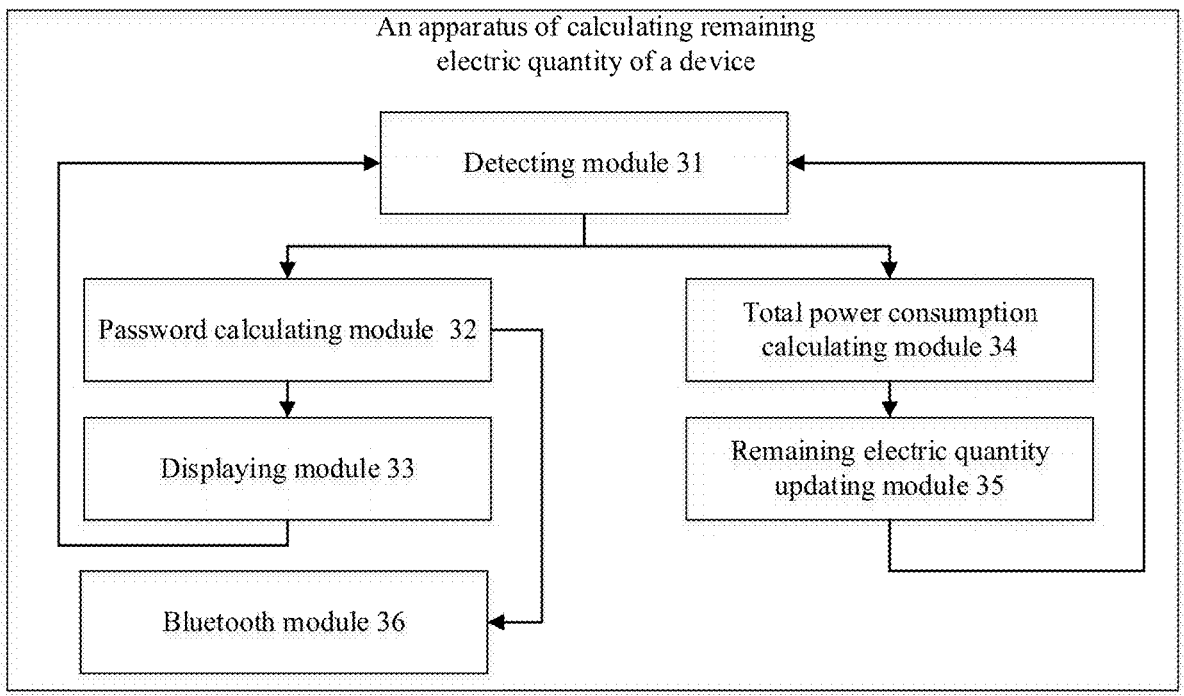
FIG. 6 is a block diagram of an apparatus of calculating remaining electric quantity of a device provided by Embodiment 9 of the present invention.

Embodiment 9 of the present invention provides an apparatus of calculating a remaining electric quantity of a device, which is applied to Bluetooth card; as shown in FIG. 6, the apparatus includes:

a detecting module 31 configured to detect flag status, when a first flag is set, trigger a password calculating module 32, when a second flag is set, trigger a total power consumption calculating module 34;

the password calculating module 32 configured to activate a timer to start counting, calculate a password, close the timer after finishing calculating a password, stop counting to obtain time for calculating the password, reset the timer, add the time for calculating the password to a fourth register, and trigger a Bluetooth module 36 and a displaying module 33;

the Bluetooth module 36 configured to activating the timer to start counting, display the password and remaining electric quantity, perform Bluetooth matching with a host computer, close the timer when the matching is success, stop counting to obtain time for Bluetooth matching, reset the timer, add the Bluetooth matching time to an eighth register, activate timer to start counting, send the password to the host computer via Bluetooth, close the timer to stop counting to obtain time for Bluetooth communicating, add the time for Bluetooth communicating to a seven register, and reset the timer;

the displaying module 33 configured to activate a timer to start counting, display the password and the remaining electric quantity, close the timer and stop counting after finishing displaying, obtaining time period for displaying and reset the timer, add the time period for displaying to a fifth register, reset the first flag, and trigger the detecting module 31;

the total power consumption calculating module 34 is configured to detect battery voltage, obtain a preset wake-up current value, a password calculating current value, a press key current value, a displaying current value, a Bluetooth communicating current value, a Bluetooth matching current value and a sleeping current value according to the detected battery voltage and a pre-stored first data table; sum up a product of the preset wake-up current value and data in a first register, a product of password calculating current value and data in a fourth register, a product of the press key current value and data in a third register, a product of the displaying current value and data in a fifth register, a product of Bluetooth communication current value and data in a seventh register, Bluetooth matching current value and data in an eighth register, a product of the sleeping current value and a result of deducting the data in the first register, the data in the fourth register and the data in the third register and the data in the fifth register and the data in the eight register from a first preset value, so as to obtain a total consumption of power;

the remaining electric quantity updating module 35 configured to update the remaining electric quantity according to the total consumption of power and a second preset value, reset the second flag, trigger the detecting module 31.

The apparatus further includes:

a real time clock interruption module configured to calculate time of the device and trigger a waking up module every preset time period;

the waking up module configured to activate a timer to start counting, update the second register with a result of adding the data in the second register to a preset time period, determine whether the data in the second register is equal to the first preset value, if yes, set the second flag, close the timer and stop counting, obtain time period for waking up, add the time period for waking up to the first register; otherwise, close the timer and stopping counting, obtain time period for waking up, and add the time period for waking up to the first register;

a press key interruption module configured to activate the timer to start counting, set the first flag, close the timer and stop counting when a second level is detected, obtain time period for pressing key, add the time period for pressing key to the third register, and quit the press key interruption.

Preferably, in Embodiment 9, the Bluetooth module is further configured to obtain a seventh value from the timer and obtain the time for Bluetooth matching according to the seventh value; further specifically is configured to obtain a sixth value from the timer register, and obtain the time for Bluetooth communicating according to the sixth value.

Preferably, in Embodiment 9, the password calculating module is further configured to close the timer after finishing password calculating, obtain a third value from a timer register, obtain time for calculating password according to the third value, and clear the third value.

Preferably, in Embodiment 9, the waking up module is further configured to close the timer for stopping counting, obtaining a first value from a timer register, obtaining the time period for waking up according to the first value and clearing the first value.

Preferably, in Embodiment 9, the displaying module is further configured to stop counting when displaying is finished, obtain a fourth value from the time register, obtain the time period for displaying according to the fourth value, add the time period for displaying to the fifth register, and clear the fourth value.

Preferably, in Embodiment 9, the displaying module further is configured to end displaying when a first level is detected, activate the timer to start counting; to close the timer and stopping counting, obtaining a second value from the timer register when a second level is detected, obtain the time period for pressing key according to the second value, add the time period for pressing key to the third register, and clear the second value.

Preferably, in Embodiment 9, the press key interruption module further is configured to close the timer and stop counting when a second level is detected, obtain the second value from the timer register, obtain the time period for pressing key according to the second value, and clear the second value.

Preferably, in Embodiment 9, the displaying module is replaced with a second displaying module, the second displaying module is configured to activate the timer to start counting, display the password, stop counting when the displaying is ended to obtain the time period for displaying, add the time period for displaying to a fifth register, resetting the first flag, and trigger the detecting module.

Preferably, in Embodiment 9, the second displaying module is further configured to activate a second timer to start counting when a first level is detected; close the second timer and stop counting when a second level is detected, obtain a fifth number from a second timer register, obtain time period for pressing key according to the fifth number, add the time period for pressing key to a third register, clearing the fifth number; if the time period for pressing key is more than or equal to a fifth preset value, to switch screen to display the remaining electric quantity; if the time period for pressing key is less than the fifth preset value, to close the timer and stopping counting, obtain a fourth value from the timer register, obtain time period for displaying according to the fourth value, add the time period for displaying to the fifth register, and clear the fourth value.

Preferably, in Embodiment 9, the remaining electric quantity updating module includes:

a first determining sub-module configured to determine whether the total consumption of power is less than a second preset value, if yes, store the total consumption of power in the power consumption counting register, trigger a second sub-determining module; otherwise, update the remaining electric quantity with the result of deducting a third preset value from the remaining electric quantity, store a difference of the total consumption of power and the second preset value in the power consumption counting register, and trigger the second determining sub-module;

the second determining sub-module is configured to determine whether the value of the power consumption counting register is less than the second preset value, if yes, restore the value in the second register to be an initial value, reset the second flag, trigger the detecting module 31, otherwise, update the remaining electric quantity with the result of deducting the third preset value from the remaining electric quantity, update the power consumption counting register with the difference of the value of the power consumption counting register and the second preset value, restore the value in the second register as the initial value, reset the second flag, trigger the detecting module 31.

Details of embodiments of the detecting method for anti-dismantling terminal and a device thereof are introduced by the present invention. The descriptions above are only specific embodiments of the present disclosure, but the scope of protection of the present disclosure is not limited to this, and any changes or replacements that can be easily derived from the present application by those skilled in the art shall fall within the scope of protection of the present disclosure. Therefore, the scope of protection of the present invention shall be subject to the those defined by the appended claims.

The invention claimed is:

1. A method for calculating remaining electric quantity of a device, comprising the following steps:
   S1) checking status of flags, executing Step S2 when a first flag is set, while executing Step S4 when a second flag is set;
   S2) activating a timer to start counting, calculating a password, closing the timer after finishing calculating the password, stopping counting to obtain time for calculating the password, resetting the timer, adding the time for calculating the password to a fourth register, executing Step S3;
   S3) displaying the password and the remaining electric quantity, resetting the first flag, going back to Step S1;
   S4) checking battery voltage, obtaining a preset wake-up current value, a password calculating current value and a displaying current value according to the battery voltage detected and a pre-stored first data table, obtaining a total consumption of power by summing up a product of the wake-up current value and data in a first register, a product of the password calculating current value and data in a fourth register, and a product of the displaying current value and a result of a first preset value minus data in the fourth register;
   S5) updating the remaining electric quantity according to the total consumption of power and a second preset value, resetting the second flag and going back to Step S1;
   in a process of executing Step S1 to Step S5, when a real time clock interruption is detected, executing Step A1 to Step A4, the real time clock interruption is triggered every first preset time period;
   A1) activating a timer to start counting, updating a second register and a sixth register by adding the first preset time period to data in the second register and the data in the sixth register respectively, when the data in the second register is equal to a fourth preset value, executing Step A2; when the data in the second register is equal to the first preset value, executing Step A3;
   A2) setting the first flag, clearing the data in the sixth register, then executing Step A4;
   A3) setting the second flag, then executing Step A4;
   A4) closing the timer to stop counting, obtaining a time period for waking up, then adding the time period for waking up into the first register.

2. The method of claim 1, wherein closing the timer after finishing calculating the password, stopping counting to obtain time for calculating the password, resetting the timer specifically comprises:
   stopping counting after finishing calculation of the password, obtaining a third value from a timer register, obtaining time for calculating the password according to the third value, then clearing the third value.

3. The method of claim 1, wherein closing the timer to stop counting, obtaining a time period for waking up specifically comprises:
   closing the timer for stopping counting, obtaining a first value from a timer register, obtaining time period for waking up according to the first value, and clearing the first value.

4. The method of claim 1, wherein the Step S5 specifically comprises:
   S5-1) determining whether a total consumption of power is less than a second preset value, if yes, storing the total consumption of power in a power consumption counting register and executing Step S5-2; otherwise, updating a remaining electric quantity with a result of deducting a third preset value from the remaining electric quantity, storing a difference between the total consumption of power and the second preset value into the power consumption counting register, then executing Step S5-2;
   S5-2) determining whether a value in the power consumption counting register is less than a second preset value, if yes, restoring the value in the second register to be an initial value and resetting the second flag, then going back to Step S1; if no, updating the remaining electric quantity with a result of deducting a third preset value from the remaining electric quantity, updating the power consumption counting register with a difference between the value of the power consumption register and the second preset value, restoring the value in the second register to be the initial value, resetting the second flag, then going back to Step S1.

5. An apparatus for calculating remaining electric quantity of a device, comprising:
   a detecting module configured to check status of flags, and trigger a password calculating module when a first flag is set, or trigger a total power consumption calculating module when a second flag is set, in which
   the password calculating module is configured to activate a timer to start counting, calculate a password, close the timer after finishing calculation of the password, stop counting to obtain time for calculating the password, reset the timer, add the time for calculating the password to a fourth register, and trigger a displaying module;
   the displaying module is configured to display the password and the remaining electric quantity, reset the first flag, and trigger the detecting module; and
   the total power consumption calculating module is configured to check battery voltage, obtaining a preset wake-up current value, a password calculating current value and a displaying current value according to the detected battery voltage and a pre-stored first data table, obtain a total power consumption by summing up a product of the wake-up current value and data in a first register, a product of the password calculating current value and data in a fourth register, and a product of the displaying current value and a result of a first preset value minus data in the fourth register;
   a remaining electric quantity updating module configured to update the remaining electric quantity according to the total power consumption and a second preset value, reset the second flag, and trigger the detecting module; and
   a real time clock module configured to calculate time of the device, and trigger a waking up module every first preset time period, in which
   the waking up module is configured to activate a timer to start counting, update a second register and a sixth register by adding the first preset time period to the data in the second register and the data in the sixth register, respectively; when the data in the sixth register is equal to a fourth preset value, set the first flag, clear the data in the sixth register, close the timer for stopping counting, obtain a time period for waking up, and add the time period for waking up into the first register; when the data in the second register is equal to the first preset value, set the second flag, close the timer to stop counting, obtain a time period for waking up, and add the time period for waking up into the first register.

6. The apparatus of claim 5, wherein the password calculating module is further configured to stop counting after finishing calculation of the password, obtain a third value from a timer register, obtain time for calculating the password according to the third value, and clear the third value.

7. The apparatus of claim 5, wherein the waking up module is further configured to close the timer and stop counting, obtain a first value from a timer register, obtain a time period for waking up according to the first value, and clear the first value.

8. The apparatus of claim 5, wherein the remaining electric quantity updating module comprises:
a first determining sub-module configured to determine whether the total power consumption is less than a second preset value, if yes, store the total power consumption into a power consumption counting register, and trigger a second determining sub-module; otherwise, update the remaining electric quantity with a result of deducting a third preset value from the remaining electric quantity, store a difference of the total power consumption and the second preset value into the power consumption counting register, and trigger the second determining sub-module;

the second determining sub-module is configured to determine whether the value in the power consumption counting register is less than a second preset value, if yes, restore the value in the second register to be an initial value, reset the second flag, and trigger the detecting module; if no, update the remaining electric quantity with a result of deducting a third preset value from the remaining electric quantity, update the power consumption counting register with a difference of the value of the power consumption register and the second preset value, restore the value in the second register to be the initial value, reset the second flag, and trigger the detecting module.

* * * * *